United States Patent
Huang et al.

(10) Patent No.: US 10,636,880 B2
(45) Date of Patent: Apr. 28, 2020

(54) METHOD OF FABRICATING ELECTRICALLY ISOLATED DIAMOND NANOWIRES AND ITS APPLICATION FOR NANOWIRE MOSFET

(71) Applicant: HRL Laboratories, LLC, Malibu, CA (US)

(72) Inventors: Biqin Huang, Rancho Palos, CA (US); Xiwei Bai, Simi Valley, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/198,274

(22) Filed: Nov. 21, 2018

(65) Prior Publication Data
US 2019/0237546 A1     Aug. 1, 2019

Related U.S. Application Data

(60) Provisional application No. 62/624,474, filed on Jan. 31, 2018.

(51) Int. Cl.
| | |
|---|---|
| *H01L 29/16* | (2006.01) |
| *H01L 29/66* | (2006.01) |
| *H01L 29/06* | (2006.01) |
| *H01L 21/02* | (2006.01) |
| *H01L 21/82* | (2006.01) |

(Continued)

(52) U.S. Cl.
CPC .... *H01L 29/1602* (2013.01); *H01L 21/02376* (2013.01); *H01L 21/02603* (2013.01); *H01L 21/0415* (2013.01); *H01L 21/266* (2013.01); *H01L 21/26586* (2013.01); *H01L 21/8206* (2013.01); *H01L 29/0669* (2013.01); *H01L 29/0673* (2013.01); *H01L 29/66015* (2013.01); *H01L 2021/26573* (2013.01)

(58) Field of Classification Search
None
See application file for complete search history.

(56) References Cited

U.S. PATENT DOCUMENTS

| | | | |
|---|---|---|---|
| 8,361,894 B1 * | 1/2013 | Hargrove | ............ H01L 27/1211 257/E21.4 |
| 8,415,640 B2 | 4/2013 | Babinec et al. | |

(Continued)

OTHER PUBLICATIONS

Babinec et al., "A diamond nanowire single-photon source", Nat Nano, vol. 5, Mar. 2010, pp. 195-199.

(Continued)

*Primary Examiner* — Steven B Gauthier
(74) *Attorney, Agent, or Firm* — Ladas & Parry

(57) ABSTRACT

A method for fabricating an electrically isolated diamond nanowire includes forming a diamond nanowire on a diamond substrate, depositing a dielectric or a polymer on the diamond nanowire and on the diamond substrate, planarizing the dielectric or the polymer, etching a portion of the planarized dielectric or polymer to expose a first portion of the diamond nanowire, depositing a metal layer to conformably cover the first portion of the diamond nanowire, and implanting ions into a second portion of the diamond nanowire between the first portion of the diamond nanowire and the diamond substrate or at an intersection of the diamond nanowire and the diamond substrate, wherein the ions are implanted at an oblique angle from a first side of the diamond nanowire.

16 Claims, 6 Drawing Sheets

(51) Int. Cl.
*H01L 21/04* (2006.01)
*H01L 21/266* (2006.01)
*H01L 21/265* (2006.01)

(56) References Cited

U.S. PATENT DOCUMENTS

| | | | |
|---|---|---|---|
| 9,200,378 B2 | 12/2015 | Xu et al. | |
| 2004/0159910 A1 | 8/2004 | Fried et al. | |
| 2007/0238273 A1* | 10/2007 | Doyle | H01L 21/26586 |
| | | | 438/525 |
| 2011/0309265 A1 | 12/2011 | Babinec et al. | |
| 2012/0147587 A1 | 6/2012 | Wober | |
| 2019/0006492 A1* | 1/2019 | Wang | H01L 21/26506 |

OTHER PUBLICATIONS

International Search Report from PCT/US2018/062342, dated Mar. 14, 2019.
Written Opinion of the International Searching Authority from PCT/US2018/062342, dated Mar. 14, 2019.
International Preliminary Report on Patentability from PCT/US2018/062342, dated Feb. 12, 2020.

* cited by examiner

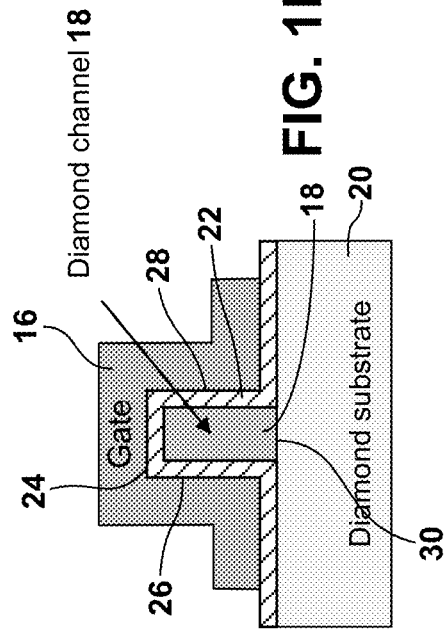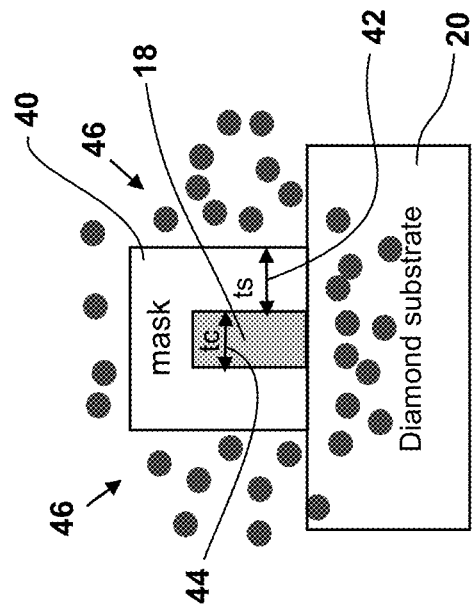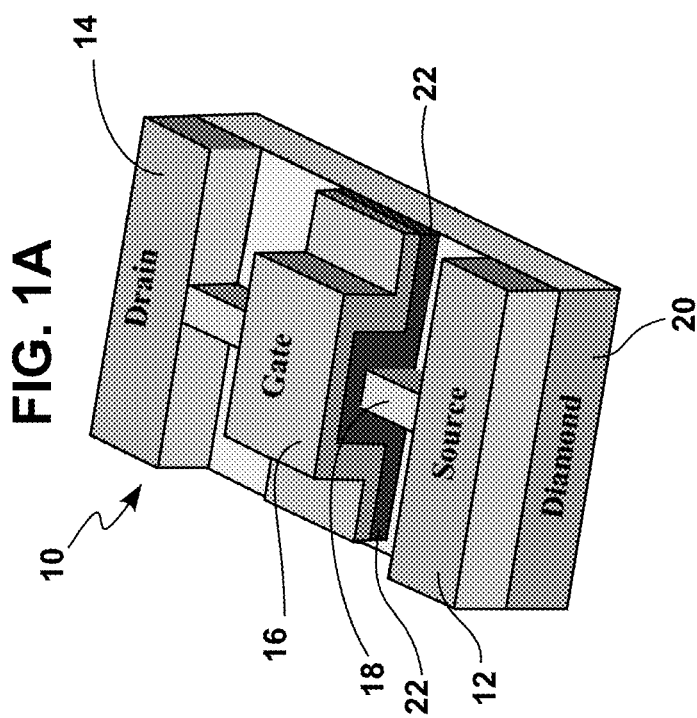

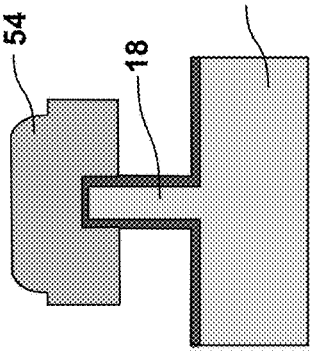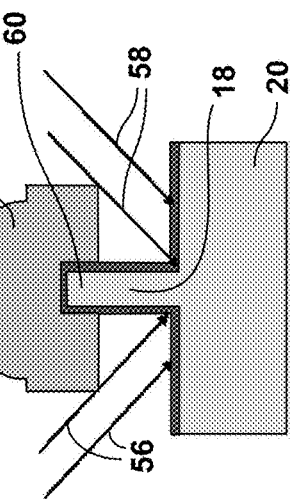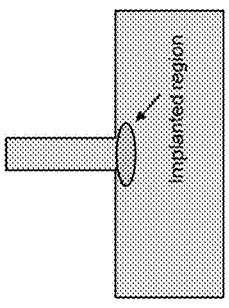
FIG. 4A Wire Formation    FIG. 4G Planarization Removal    FIG. 4H Ion Implantation
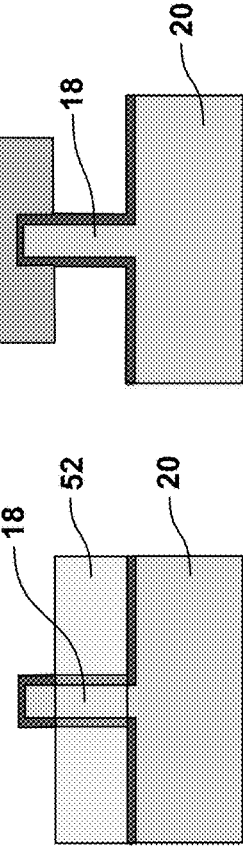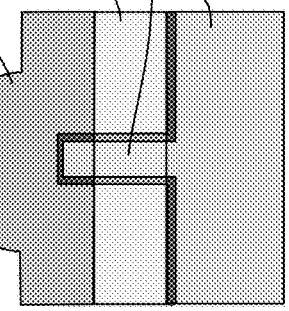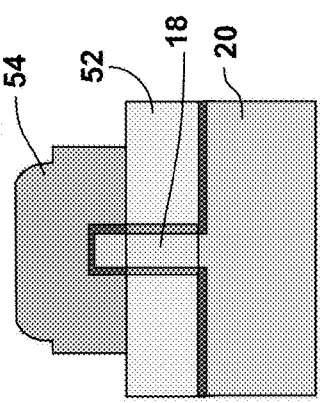
FIG. 4B ALD Protection    FIG. 4E Metal Sputtering    FIG. 4I Mask Removal
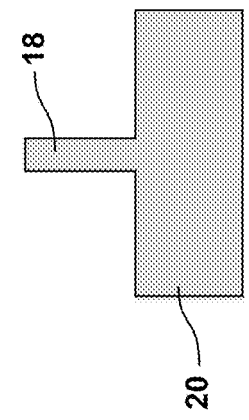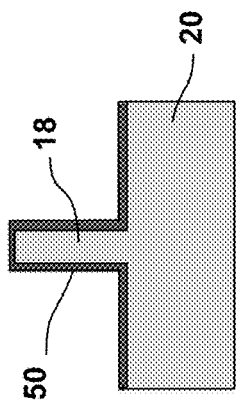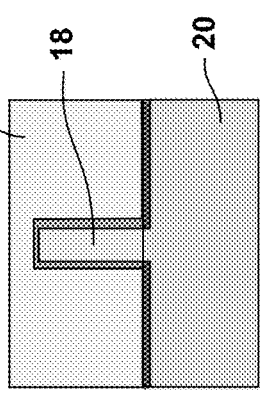
FIG. 4C Planarization    FIG. 4D Etch Back    FIG. 4F Metal Patterning and claims priority from U.S.
METHOD OF FABRICATING ELECTRICALLY ISOLATED DIAMOND NANOWIRES AND ITS APPLICATION FOR NANOWIRE MOSFET

CROSS REFERENCE TO RELATED APPLICATIONS

This application is related to and claims priority from U.S. Provisional Patent Application Ser. No. 62/624,474, filed Jan. 31, 2018, which is incorporated herein by reference as though set forth in full.

STATEMENT REGARDING FEDERAL FUNDING

None

TECHNICAL FIELD

This disclosure relates to diamond nanowires for various electronic and photonic applications.

BACKGROUND

In the prior art, active semiconductor devices may be isolated using a traditional p/n junction or by fabricating a semiconductor on oxide. Creating an isolation layer for active diamond electronics using traditional p/n junction or fabricating a semiconductor on oxide has challenges. Even though those techniques are widely practiced in silicon and other semiconductors, it is still very challenging to produce a p/n junction in diamond, especially in selective device areas. There is also no suitable solution to create diamond on dielectric structures like silicon on insulator (SOI) for device isolation. Another prior art approach is to grow diamond nanowire through various growth techniques similar to carbon nanotube growth. However, this approach also has challenges in precisely placing the wires on the desired area for further manufacturing. Another technique is to transfer a diamond thin film to another substrate to create nanowire devices; however, this is a complicated method and is not suitable for large scale production.

T. M. Babinec, J. M. HausmannBirgit, M. Khan, Y. Zhang, J. R. Maze, P. R. Hemmer, et al., "A diamond nanowire single-photon source," Nat Nano, vol. 5, pp. 195-199, 03//print 2010 and U.S. Pat. No. 8,415,640, issued on Apr. 9, 2013, which are incorporated herein by reference, use microfabrication techniques to create vertical nanowires. The wires are not electrically isolated from the substrate, and electrons and holes, if available, are free to move around. Hence, the individual wires are not isolated from each other.

U.S. Pat. No. 9,200,378, issued on Dec. 1, 2015, which is incorporated herein by reference, describes growing diamond nanowires via chemical vapor deposition. However, this method is not suitable for large scale semiconductor device manufacturing.

What is needed is an improved method for making diamond nanowires for various electronic and photonic applications. The embodiments of the present disclosure answer these and other needs.

SUMMARY

In a first embodiment disclosed herein, a method for fabricating an electrically isolated diamond nanowire comprises forming a diamond nanowire on a diamond substrate, depositing a dielectric or a polymer on the diamond nanowire and on the diamond substrate, planarizing the dielectric or the polymer, etching a portion of the planarized dielectric or polymer to expose a first portion of the diamond nanowire, depositing a metal layer to conformably cover the first portion of the diamond nanowire, and implanting ions into a second portion of the diamond nanowire between the first portion of the diamond nanowire and the diamond substrate or at an intersection of the diamond nanowire and the diamond substrate, wherein the ions are implanted at an oblique angle from a first side of the diamond nanowire.

In another embodiment disclosed herein, an electrically isolated diamond nanowire comprises a diamond substrate, a diamond nanowire on the diamond substrate, and a plurality of ions implanted in the diamond nanowire below a top portion of the diamond nanowire, or at an intersection of the diamond nanowire and the diamond substrate.

In yet another embodiment disclosed herein, a field effect transistor comprises a diamond substrate, a channel on the diamond substrate, wherein the channel is a diamond nanowire, and a plurality of ions implanted in the diamond nanowire below a top portion of the diamond nanowire, or at an intersection of the diamond nanowire and the diamond substrate, wherein the plurality of ions are implanted at an oblique angle from a side of the diamond nanowire.

In still another embodiment disclosed herein, a method for fabricating an electrically isolated diamond nanowire comprises providing a diamond substrate, forming a diamond nanowire on the diamond substrate, and implanting ions in the diamond nanowire below a top portion of the diamond nanowire, or at an intersection of the diamond nanowire and the diamond substrate, wherein the plurality of ions are implanted at an oblique angle from a side of the diamond nanowire.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 1A shows a device schematic for a diamond nanowire transistor, FIG. 1B shows a cross-section of the channel with gate and dielectric, and FIG. 1C shows a schematic drawing of a typical implantation process in accordance with the present disclosure;

FIG. 3A diamond, FIG. 3B tungsten, and FIG. 3C aluminum in accordance with the present disclosure; and FIGS. 4A, 4B, 4C, 4D, 4E, 4F, 4G, 4H and 4I show a process flow for creating a masking structure for diamond ion implantation in accordance with the present disclosure.

DETAILED DESCRIPTION

Figure 2:
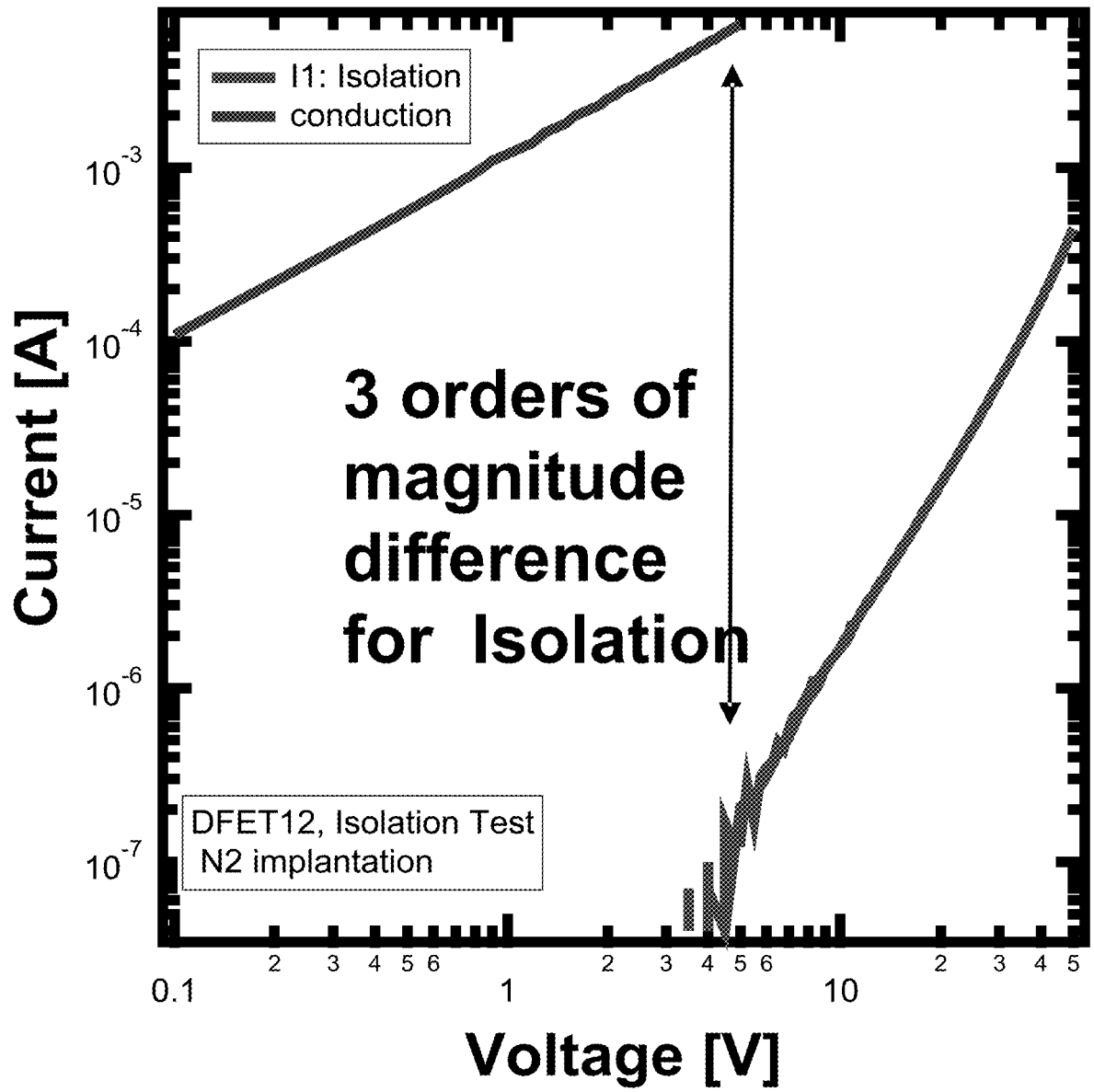
FIG. 2 shows a graph of the conduction of a p type diamond material before and after $N_2$ implantation, indicating the effectiveness of implantation for device isolation in accordance with the present disclosure.

In the following description, numerous specific details are set forth to clearly describe various specific embodiments disclosed herein. One skilled in the art, however, will understand that the presently claimed invention may be practiced without all of the specific details discussed below.

In other instances, well known features have not been described so as not to obscure the invention.

The present disclosure describes a device and a method for creating a diamond nanowire physically attached to a diamond substrate but electrically isolated from the substrate, which allows the creation of various devices such as a diamond nanowire MOSFET. The present disclosure also describes a method and process to create diamond nanowires out of a homogeneous diamond substrate for various electronic and photonic applications. A masking structure is described for ion implantation to selectively break a diamond lattice under the diamond nanowires without degrading the material quality of the nanowire itself. The method uses a combination of microfabrication and ion implantation to create diamond nanowires horizontally on top of the diamond substrate.

FIG. 1A shows the schematic drawing of a field effect transistor 10, which has a source 12, a drain 14, a gate 16 and a channel 18, which is a diamond nanowire, on a diamond substrate 20. The gate 16 around the nanowire channel 18 modulates the current transport from the source 12 to the drain 14. The gate 16 is insulated from the channel 18 by dielectric 22.

FIG. 1B shows a cross-section of the device 10 in the gate area showing the gate 16, the dielectric 22 and the diamond nanowire channel 18. The channel 18 is controlled by the gate 16 through three surfaces of the gate 16: the top 24 of the gate 16 and the two sides 26 and 28 of the gate 16. The bottom 30 of the channel 18 is on top of and connected to the diamond substrate 20. In order to make a functional device, the leakage path from the source 12 to the drain 14 through the substrate 20 needs to be effectively blocked.

For a typical prior art device design in the silicon industry, a FinFET style device, has a punch through stop layer underneath the channel to isolate the fin channel from the substrate. The existence of p/n junction effectively blocks the current flowing from source to drain through the substrate. Therefore the only effective current path is the channel which is controlled by the gate. The other prior art approach is to build a silicon device on oxide using SOI wafers. In this case, the channel is naturally separated from the substrate. However, for diamond electronics, there is no corresponding material such as diamond on oxide. So the only feasible approach is to electrically isolate the channel from the substrate.

FIG. 2 shows a graph of measurements for boron diamond conductivity before and after nitrogen ($N_2$) ion implantation. As shown, the conductivity drops by 3 orders of magnitude after $N_2$ implantation, which indicates that ion implantation in diamond can achieve device isolation. Other ions that may be used include argon, hydrogen, helium and other inert gases.

FIG. 1C shows a typical ion implantation process to create an isolation layer underneath the channel 18 to isolate the channel 18 from the diamond substrate 20. A mask layer 40 with thickness ts 42 is used to protect the active channel 18 during ion implantation. The channel 18 has thickness tc 44. The mask layer 40 needs to effectively block all incoming high energy ions 46 so that the active fin channel 18 will not degrade. The distance implanted ions travel in materials is determined by the stop power of the material. For a typical silicon implantation, the use of a dielectric or a metal is enough for masked ion implantation because most of ion implantation species have much deeper ion range in silicon than those mask materials. However, this is not the case for diamond.

Figure 3A:
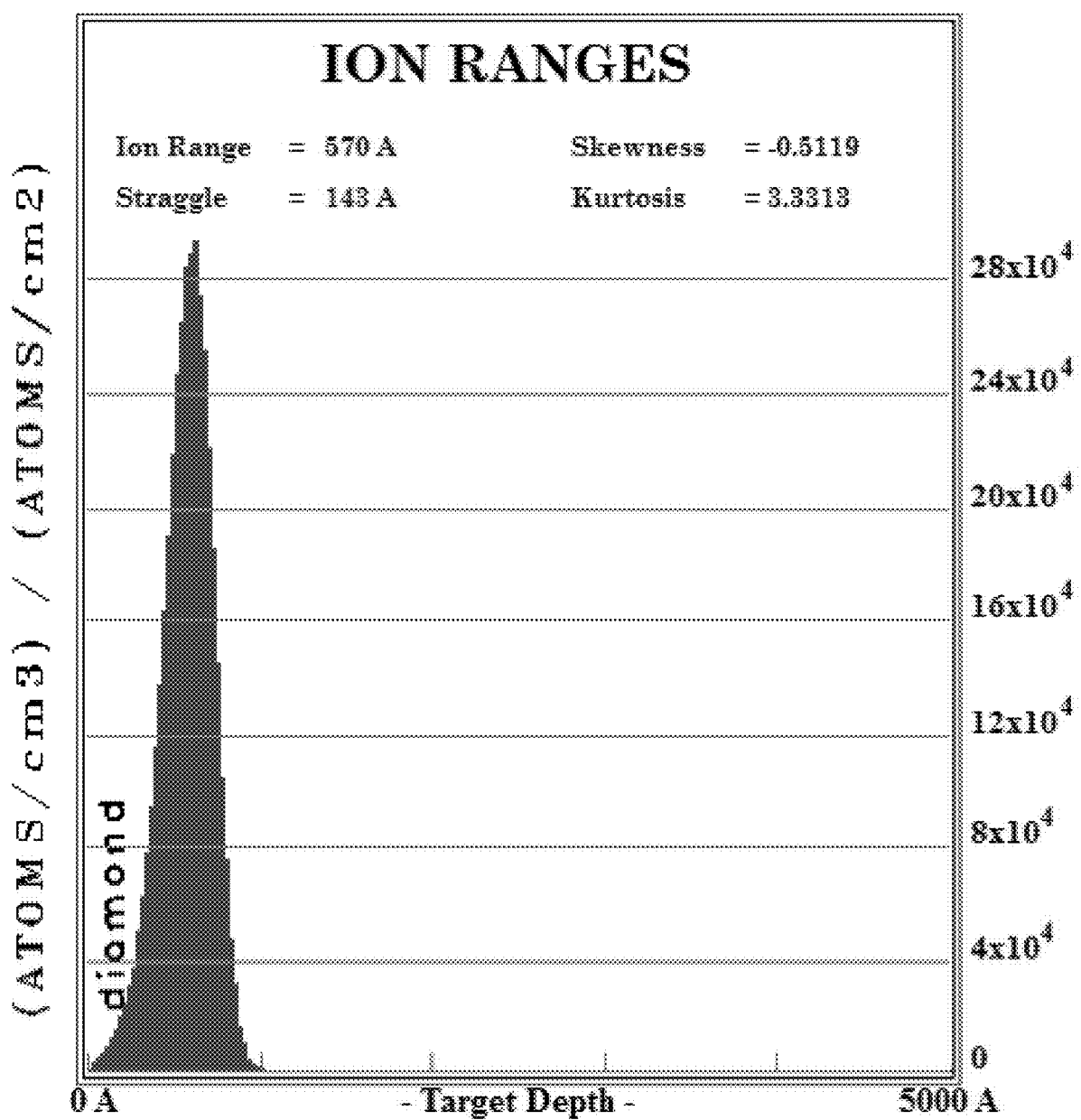
FIGS. 3A, 3B, and 3C show the ion range of 45 keV $N_2$ implantation at 45 degree in various materials.
Figure 3B:
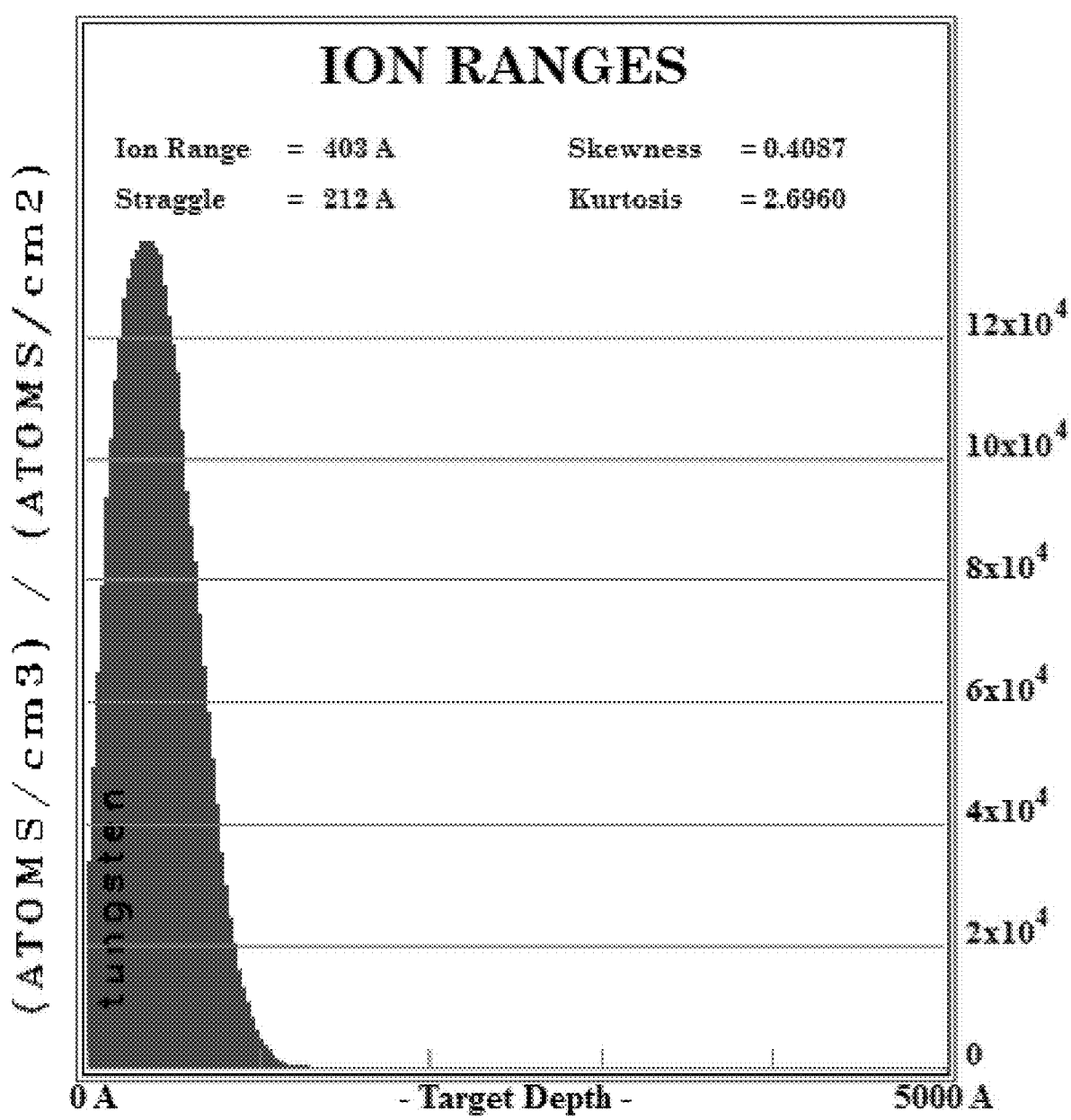
Figure 3C:
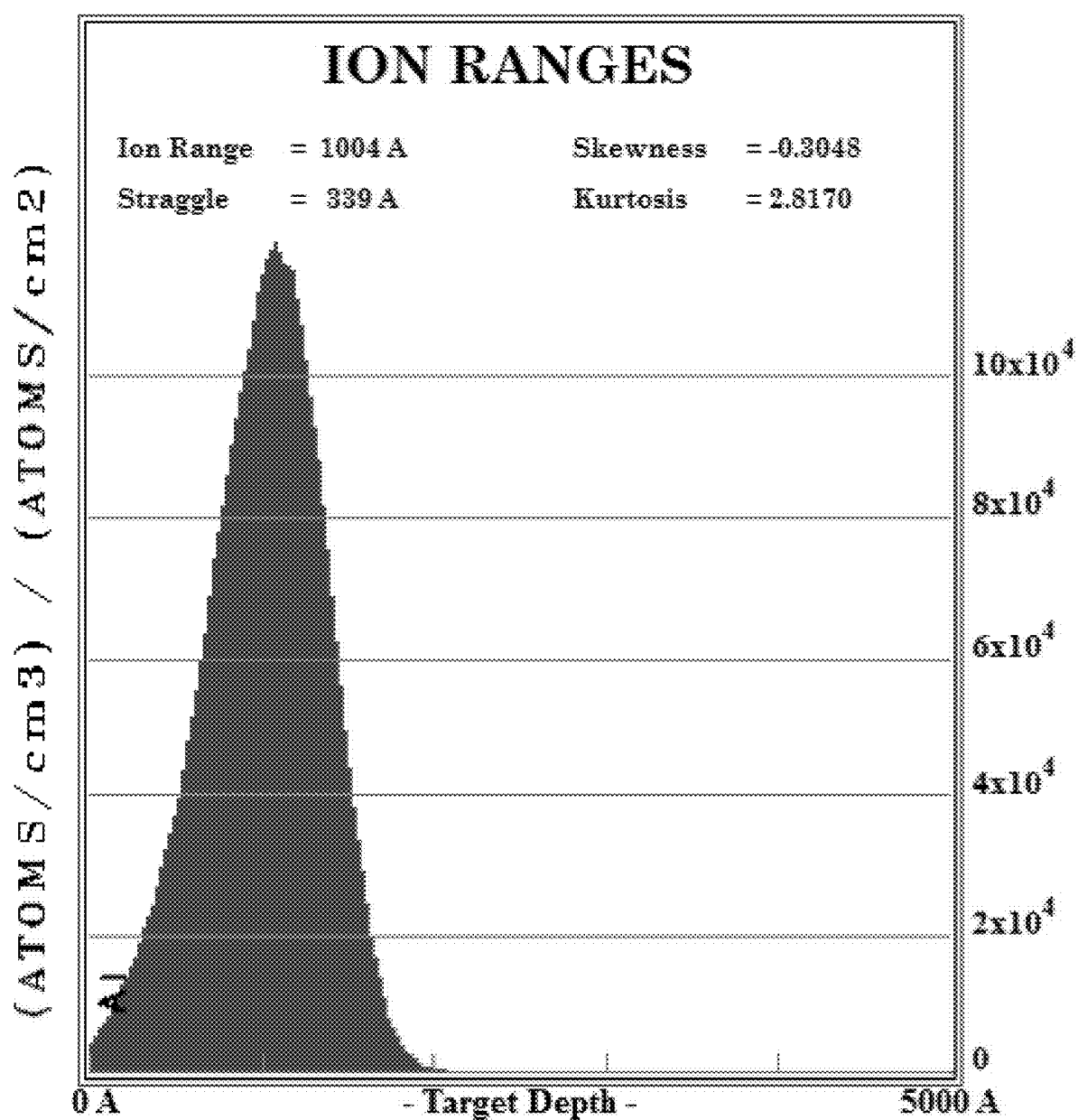

FIGS. 3A, 3B and 3C show the ion range of $N_2$ ion implantation in different materials, diamond, tungsten (W) and aluminum (Al), respectively. The implantation energy used for the measurement is 45 keV and the implantation angle is 45°. Typically a heavier metal has a shorter ion range, and tungsten is heavier than aluminum, so as shown in FIGS. 3B and 3C, the ion range in tungsten is only about 40 nm, while in aluminum the ion range is about 100 nm. In diamond the ion range is about 57 nm which is only slightly larger than tungsten. Other heavy metals can be used such as bismuth, molybdenum, or tin.

As shown in FIG. 1C, in order to completely implant the diamond area underneath the channel, the implanted ions need to travel at least by the range of ts+tc/2, for double side implantation from sides 26 and 28. Because the diamond implanted region is determined by the mask thickness, the ion range difference between the masking layer and diamond needs to be larger than tc/2 which is typically on the order of 100 nm. However, there are no obvious masking materials available with this feature.

FIGS. 4A, 4B, 4C, 4D, 4E, 4F, 4G, 4H and 4I show a process flow for creating a masking structure for diamond ion implantation that overcomes this issue. As shown in FIG. 4A, the process starts by forming a nanowire or fin for a diamond channel 18 on the diamond substrate 20. Then, as shown in FIG. 4B, an atomic layer deposition (ALD) layer of deposited dielectric 50 is used to protect the surface of the channel 18. The deposition may also be done using chemical vapor deposition (CVD), such as plasma-enhanced chemical vapor deposition (PECVD) and physical vapor deposition (PVD), such as sputtering and evaporation. This is an optional step. Next, as shown in FIG. 4C, a dielectric or polymer 52 is deposited by spin coating or deposition and covers the channel 18. One example dielectric or polymer is polydimethylglutarimide (PMGI) resist coating, or a spin on glass (SOG) coating. Other dielectrics or polymers include polyimide and bisbenzocyclobutene. Then the dielectric or polymer 52 is planarized. A chemical mechanical polishing (CMP) process or a dry etch process may be used to planarize the dielectric or polymer 52. Then, as shown in FIG. 4D, the planarized surface of the dielectric or polymer 52 is etched back using a dry or wet etch to expose a portion of the channel 18 between a top portion of the channel 18 and the substrate 20. Next, as shown in FIG. 4E, a metal layer 54 is deposited to conformably cover the top portion of the channel 18 and the surface of the etched back dielectric or polymer 52. Then, as shown in FIG. 4F, the metal layer 54 may be patterned by lithography and wet or dry etched so that only the top portion of the channel 18 is covered. Next, as shown in FIG. 4G, the dielectric or polymer 52 is removed by isotropic etch so that no dielectric or polymer material is underneath the masking metal layer 54. Alternatively, the dielectric or polymer 52 can be left in place if the ion range of implanted ions in the dielectric or polymer 52 layer is sufficiently smaller than in the masking metal layer 54. Then, as shown in FIG. 4H, ion implantations 56 and 58, each at an oblique angle, may be performed on both sides of the channel 18. The implanted ions may be p type or n type ions. The ion implantations 56 and 58 implant species into the channel 18 between the top portion of the channel 18 and the diamond substrate 20 and or at the intersection of the channel 18 and the substrate 20. The metal mask 54 masks the active part 60 of the channel 18 from ion implantation. Finally, as shown in step 4I, the metal mask layer 54 and the protection layer dielectric 50 may be removed.

With this process, the implanted region in the diamond substrate 20 under the channel 18 is only tc/2 thick, as shown in FIG. 4H, assuming double implantation is used. The blocking metal mask thickness may be ts. Since the diamond implanted region in this process is decoupled from the metal mask thickness, it is much easier to find a mask to ensure successful implantation in diamond. A typical diamond channel may have a thickness of around 100 nm. As shown in FIG. 3B, 200 nm tungsten (W) for the metal mask layer 54 would be sufficient to block a 45 keV $N_2$ implantation.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for fabricating an electrically isolated diamond nanowire comprising:
    forming a diamond nanowire on a diamond substrate;
    depositing a dielectric or a polymer on the diamond nanowire and on the diamond substrate;
    planarizing the dielectric or the polymer;
    etching a portion of the planarized dielectric or polymer to expose a top portion of the diamond nanowire;
    depositing a metal layer to conformably cover the top portion of the diamond nanowire; and
    implanting ions into the diamond substrate below an intersection of the diamond nanowire and the diamond substrate;
    wherein the ions are implanted at an oblique angle from a side of the diamond nanowire;
    wherein the top portion of the diamond nanowire covered by the metal layer is not implanted with the ions; and
    wherein the ions implanted into the diamond substrate electrically isolate the diamond nanowire from the diamond substrate.

2. The method of claim 1 further comprising:
    removing the dielectric or polymer before implanting ions.

3. The method of claim 1 further comprising:
    depositing by atomic layer deposition (ALD), chemical vapor deposition (CVD), or physical vapor deposition (PVD), a second dielectric on the diamond nanowire to protect a surface of the diamond nanowire before depositing the dielectric or the polymer on the diamond nanowire and on the diamond substrate.

4. The method of claim 1 further comprising:
    patterning and etching the metal layer.

5. The method of claim 1 wherein the dielectric or the polymer is a polydimethylglutarimide resist coating or a spin on glass coating.

6. The method of claim 1 wherein planarizing the dielectric or the polymer comprises chemical mechanical polishing, or dry etching.

7. The method of claim 2 wherein removing the dielectric or polymer comprises an isotropic etch so that no dielectric or polymer material remains underneath the metal layer.

8. The method of claim 1:
    wherein the metal layer comprises a tungsten layer, bismuth, molybdenum, or tin.

9. The method of claim 8 wherein the tungsten layer is at least 200 nm thick.

10. The method of claim 1:
    wherein the implanted ions comprise $N_2$, argon, hydrogen, helium or another inert gases.

11. The method of claim 1 further comprising removing the metal layer.

12. The method of claim 1 wherein the ions are implanted at an oblique angle from a first side and a second side of the diamond nanowire.

13. The method of claim 1 wherein the diamond nanowire is a channel for a field effect transistor.

14. The method of claim 13 further comprising:
    depositing a third dielectric over the channel;
    forming a gate over the third dielectric;
    forming a drain for the field effect transistor on the diamond substrate and coupled to a first end of the diamond nanowire; and
    forming a source for the field effect transistor on the diamond substrate and coupled to a second end of the diamond nanowire;
    wherein the third dielectric insulates the gate from the channel.

15. A method for fabricating an electrically isolated diamond nanowire comprising:
    providing a diamond substrate;
    forming a diamond nanowire on the diamond substrate;
    depositing a metal layer to conformally cover a top portion of the diamond nanowire; and
    implanting ions in the diamond nanowire below an intersection of the diamond nanowire and the diamond substrate;
    wherein the ions are implanted at an oblique angle from a side of the diamond nanowire;
    wherein the top portion of the diamond nanowire covered by the metal layer is not implanted with the ions; and
    wherein the ions implanted into the diamond substrate electrically isolate the diamond nanowire from the diamond substrate.

16. The method of claim 15:
wherein the metal layer comprises a tungsten layer, bismuth, molybdenum, or tin.

\* \* \* \* \*